United States Patent
Chambion et al.

(10) Patent No.: US 11,769,785 B2
(45) Date of Patent: Sep. 26, 2023

(54) PROCESS FOR COLLECTIVELY CURVING A SET OF ELECTRONIC CHIPS

(71) Applicant: Commissariat a l'Energie Atomique et aux Energies Alternatives, Paris (FR)

(72) Inventors: Bertrand Chambion, Grenoble (FR); Jean-Philippe Colonna, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 454 days.

(21) Appl. No.: 17/072,460

(22) Filed: Oct. 16, 2020

(65) Prior Publication Data

US 2021/0118940 A1    Apr. 22, 2021

(30) Foreign Application Priority Data

Oct. 17, 2019  (FR) ...................................... 19 11605

(51) Int. Cl.
*H01L 27/146* (2006.01)

(52) U.S. Cl.
CPC .... *H01L 27/14698* (2013.01); *H01L 27/1464* (2013.01); *H01L 27/1469* (2013.01); *H01L 27/14634* (2013.01); *H01L 27/14636* (2013.01)

(58) Field of Classification Search
None
See application file for complete search history.

(56) References Cited

U.S. PATENT DOCUMENTS

| | | | |
|---|---|---|---|
| 2009/0115875 A1 | 5/2009 | Choi et al. | |
| 2019/0140008 A1 | 5/2019 | Chambion et al. | |
| 2019/0371854 A1 | 12/2019 | Chambion et al. | |

FOREIGN PATENT DOCUMENTS

| | | |
|---|---|---|
| EP | 3 480 850 A1 | 5/2019 |
| FR | 3 061 990 A1 | 7/2018 |

OTHER PUBLICATIONS

French Preliminary Search Report dated Jul. 9, 2020 in French Application 19 11605 filed on October 17, 2019 (with English Translation of Categories of Cited Documents & Written Opinion), 9 pages.

*Primary Examiner* — Suberr L Chi
(74) *Attorney, Agent, or Firm* — Oblon, McClelland, Maier & Neustadt, L.L.P.

(57) ABSTRACT

A process includes providing electronic chips, the chips having been diced beforehand and each including a stack including a matrix-array of pixels, an interconnect layer, first layer, joining the electronic chips to a carrier substrate, so as to leave a spacing region between the chips; forming a redistribution layer having lateral ends extending into each spacing region; forming metal pillars on the lateral ends; moulding a material including first segments, facing the first layers, second segments which are separate from the first segments, and which extend around the metal pillars; the first and second segments being coplanar; applying a heat treatment, the formed material being chosen so that the stack is curved with a convex shape; the second segments remaining coplanar at the end.

16 Claims, 4 Drawing Sheets

PROCESS FOR COLLECTIVELY CURVING A SET OF ELECTRONIC CHIPS

TECHNICAL FIELD

The invention relates to the field of collective curvature of electronic chips. By "collectively" or "collective", what is meant is simultaneous curvature of a set of singulated electronic chips, i.e. after their fabrication on a wafer and after dicing thereof within the wafer. Therefore, the terms "collectively" and "collective" do not here designate, as they sometimes do, a process carried out on the scale of the wafer on which the electronic chips are formed (i.e. a wafer-level process or WLP).

The invention is notably applicable to the fabrication of curved image sensors, or curved displays, able to be integrated into an optical system (e.g. a photographic objective) in order to increase the compactness of the optical system, or to improve the optical performance thereof (e.g. compensate for field curvature and astigmatism).

PRIOR ART

A process for curving electronic chips that is known in the prior art, notably from document US 2006/0038183 A1 (D1 below), comprises a step consisting in arranging flexor units to curve the electronic chips. In particular, D1 discloses (FIG. 11, paragraph 0042) curving on the scale of a singulated electronic chip. A flexor unit comprises:
- standoffs formed on the substrate, and extending around the electronic chip,
- a transparent cover, joining the spacers, and lying above the electronic chip.

The coefficient of thermal expansion of the transparent cover is chosen depending on that of the substrate so as to curve the electronic chip after cooling of the transparent cover.

This prior-art process is therefore not entirely satisfactory in so far as it does not allow:
- electrical contacts to be easily produced on the backside of the substrate, in order to make an electrical contact to a package or a circuit board, after curvature of the electronic chip,
- collective curvature in the sense of a simultaneous curvature of a set of singulated electronic chips.

DISCLOSURE OF THE INVENTION

The invention aims to fully or partly rectify the above-mentioned drawbacks. To this end, the subject of the invention is a process for collectively curving a set of electronic chips, comprising the steps:

a) providing the set of electronic chips, said chips having been diced beforehand and each comprising a stack comprising:
- a matrix-array of pixels,
- an interconnect layer, electrically connected to the matrix-array of pixels,
- a first layer, comprising through-vias that are electrically connected to the interconnect layer; the stack possessing a first thickness and a first coefficient of thermal expansion;

b) joining the set of diced electronic chips to a carrier substrate, via the side opposite the first layers, so as to leave a spacing region between adjacent electronic chips;

c) forming a redistribution layer comprising metal tracks that are electrically connected to the through-vias, the metal tracks having lateral ends extending into each spacing region;

d) forming metal pillars on the lateral ends of the metal tracks;

e) moulding a material on the redistribution layer, the material comprising:
- first segments, facing the first layers of the electronic chips,
- second segments, which are separate from the first segments, and which extend in the spacing regions around the metal pillars; the first and second segments of the material being coplanar; the material possessing a formation temperature;

f) applying a heat treatment at the formation temperature of the material, the first and second segments of the material being mechanically attached to the first layers and to the carrier substrate, respectively, the formed material possessing a second thickness, and a second coefficient of thermal expansion strictly higher than the first coefficient of thermal expansion; the ratio between the first and second coefficients of thermal expansion, the ratio between the first and second thicknesses and the formation temperature being adapted so that, at the end of step f), the stack of each electronic chip is curved with a preset convex shape, which is oriented toward the matrix-array of pixels, at a given corresponding operating temperature of the electronic chip; the second segments of the material formed around the metal pillars remaining coplanar at the end of step f).

Thus, such a process according to invention allows both:
(i) collective curvature in the sense of simultaneous curvature of a set of singulated electronic chips, which are joined to a carrier substrate in step b) and curved at the end of step f);
(ii) electrical contacts to be easily produced by virtue of the second segments of the material formed around the metal pillars, which remain coplanar at the end of step f).

As regards point (i), the curvature results from thermo-mechanical stresses that are released after the cooling of the material at the end of step f), i.e. when the material is brought to the operating temperature of the electronic chip. The stack experiences thermomechanical stresses because of the first segments of the formed material, which is formed so as to be attached to the first layers (bimetal effect). By "release thermomechanical stresses", what is meant is the conversion of thermomechanical stresses experienced by the stack into deformation (curvature).

As regards point (ii), the second segments of the material remain coplanar (i.e. uncurved) at the end of step f), contrary to the first segments of the material, because on the one hand the second segments of the material are separate from the first segments in step e), and on the other hand the second segments of the material are mechanically attached to the carrier substrate in step f).

Definitions

By "electronic chip", what is meant is a portion of a substrate having undergone technological steps with a view to forming an electronic component intended to be mounted on a circuit board or in a package.

By "substrate", what is meant is a self-supporting physical carrier.

By "pixels", what is meant is:
- the photosensitive cells (also called photosites) in the case of an electronic chip of an image sensor,
- the light-emitting (or emissive) cells in the case of an electronic chip of a display.

By "interconnect layer", what is meant is a stack of interconnect levels comprising metal tracks embedded in a dielectric material.

By "through-via", what is meant is a metallized hole allowing an electrical contact to be made to the interconnect layer. In the case where the first layer is made of silicon, the through-via is a through-silicon via (TSV).

By "redistribution layer", what is meant is a layer allowing interconnect tracks to be routed to the periphery of the electronic chip with a view to redistributing future electrical contacts.

By "mechanically attached", what is meant is that the first segments of the material have a sufficient energy of adhesion to the first layers to obtain the curvature of the stacks and to prevent them debonding from the stacks. In the same way, what is meant is that the second segments of the material have a sufficient energy of adhesion to the carrier substrate (and where appropriate to any layer intermediate between the carrier substrate and the second segments of the material) to prevent debonding thereof.

By "preset", what is meant is the convex shape desired for the envisaged application.

By "oriented toward the matrix-array of pixels", what is meant is that the convex shape obtained at the end of step f) defines (curved) convex surfaces within the stack that point toward the free surface of the stack, on the side of the matrix-array of pixels, opposite the through-vias.

The process according to the invention may include one or more of the following features.

According to one feature of the invention, step f) is preceded by a step $e_1$) consisting in planarizing the material so as to free the metal pillars.

By "planarizing", what is meant is that the free ends of the metal pillars (i.e. the ends surrounded by the second segments of the material) lie in the same plane with a tolerance of 100 µm, preferably of 50 µm, and more preferably of 25 µm. The tolerance corresponds to the maximum distance between the plane and a free end of the metal pillar. A tolerance lower than one quarter of the characteristic dimension (e.g. diameter) of the solder bumps that it is envisaged to use to make an electrical contact between the metal pillars and a package (or a circuit board) will advantageously be chosen. For example, for solder bumps possessing a diameter of 100 µm, the tolerance is lower than 25 µm.

According to one feature of the invention, the process comprises a step g) consisting in forming solder bumps on the second segments of the material at the end of step f), the solder bumps making contact with the metal pillars.

The term "solder bump" covers not only the case where the solder is different from the materials to be joined but also the case where it is the same.

Thus, one procured advantage is to be able to make an electrical contact to a circuit board (or to a package).

According to one feature of the invention, step g) is followed by a step h) consisting in dicing the electronic chips.

Step h) allows the chips to be singulated before they are packaged or encapsulated.

According to one feature of the invention, step b) is executed so that the carrier substrate is transparent in the spectral domain of operation of the electronic chips.

Thus, one procured advantage is to be able to use the carrier substrate as a cover to protect the electronic chips.

Hence, there is no need for subsequent steps of packaging or encapsulating the electronic chips after step h) of dicing.

According to one feature of the invention, step b) is executed so that the carrier substrate comprises spacers to which the diced electronic chips are joined.

Thus, the spacers allow a spacing region to be defined between adjacent electronic chips. The spacers are mechanically attached to the carrier substrate.

According to one feature of the invention, step c) comprises the steps:
$c_1$) forming a dielectric layer that fills the spacing regions so as to lie flush with the first layers of the electronic chips, the dielectric layer being mechanically attached to the carrier substrate;
$c_2$) forming the redistribution layer, the latter extending over the first layers of the electronic chips and over the dielectric layer, the redistribution layer being mechanically attached to the first layers and to the dielectric layer.

Thus, it is made possible to redistribute future electrical contacts to the periphery of the electrical chips by virtue of the dielectric layer and the redistribution layer. Step f) is executed so that the first and second segments of the material are mechanically attached to the redistribution layer. As a result, the first and second segments of the material are mechanically attached, indirectly, to the first layers and to the carrier substrate, respectively.

According to one feature of the invention, step a) comprises the steps:
$a_1$) providing a first substrate, on which is formed the set of electronic chips;
$a_2$) joining a temporary substrate to the set of electronic chips;
$a_3$) thinning the first substrate until the first layer is obtained;
$a_4$) forming through-vias in the first layer;
$a_5$) dicing the electronic chips individually.

Thus, one advantage procured by the thinning of the first substrate is to promote the curvature of the electronic chips at the end of step f).

According to one feature of the invention, step a) is executed so that:
the interconnect layer is formed on the first layer,
the matrix-array of pixels is formed on the interconnect layer,
the stack comprises a matrix-array of focusing lenses, formed on the matrix-array of pixels.

Thus, a back-side-illuminated (BSI) image sensor is obtained. The incident light penetrates into the matrix-array of pixels, which is located upstream of the interconnect layer, this preventing energy loss, and thereby increasing the sensitivity of the image sensor.

According to one feature of the invention, step a) is executed so that:
the matrix-array of pixels is formed on the first layer,
the interconnect layer is formed on the matrix-array of pixels,
the stack comprises a matrix-array of focusing lenses, formed on the interconnect layer.

Thus, a front-side-illuminated (FSI) image sensor is obtained. The incident light penetrates via the interconnect layer and the matrix-array of pixels is located downstream of the interconnect layer.

According to one feature of the invention, step e) is executed so that the material is a thermosetting polymer, preferably chosen from an epoxy resin and a polysiloxane resin.

Thus, one procured advantage is to be able to mould the material using an injection mould.

According to one feature of the invention, step f) is executed so that the first and second coefficients of thermal expansion respect:

$\alpha_2/\alpha_1 \geq 4$, and preferably $\alpha_2/\alpha_1 \geq 6$, where:
$\alpha_1$ is the coefficient of thermal expansion of the stack,
$\alpha_2$ is the coefficient of thermal expansion of the formed material.

Thus, one procured advantage is to permit the convex shape, and thereby the electronic chips, to have high radii of curvature. The radius of curvature may be computed depending on $\alpha_1$ and $\alpha_2$ using Stoney's formula.

According to one feature of the invention, step f) is executed so that the formed material possesses a Young's modulus higher than 100 MPa, preferably higher than 1 GPa, and more preferably higher than 3 GPa.

Thus, one procured advantage is to obtain a material of satisfactory rigidity, permitting the desired curvature of the stack in step f).

BRIEF DESCRIPTION OF THE DRAWINGS

Other features and advantages will become apparent in the detailed description of various embodiments of the invention, the description being accompanied by examples and references to the appended drawings.

Figure 1A:
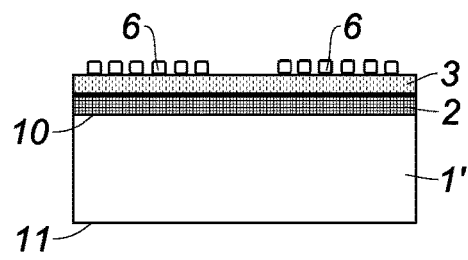
FIGS. 1a to 1d are schematic cross-sectional views illustrating the preparation of FSI image sensors in step a) of a process according to the invention.
Figure 1B:
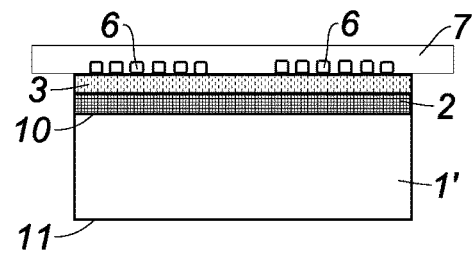
Figure 1C:
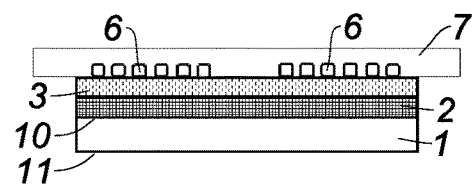

It should be noted that, for the sake of legibility and ease of understanding, the drawings described above are schematic and not to scale.

DETAILED DISCLOSURE OF THE EMBODIMENTS

For the sake of simplicity, elements that are identical or that perform the same function in the various embodiments have been designated by the same references.

One subject of the invention is a process for collectively curving a set of electronic chips P, comprising the steps:

a) providing the set of electronic chips P, said chips having been diced beforehand and each comprising a stack comprising:

a matrix-array of pixels 2,
an interconnect layer 3, electrically connected to the matrix-array of pixels 2,
a first layer 1, comprising through-vias 100 that are electrically connected to the interconnect layer 3; the stack possessing a first thickness and a first coefficient of thermal expansion;

b) joining the set of diced electronic chips P to a carrier substrate SS, via the side opposite the first layers 1, so as to leave a spacing region ZE between adjacent electronic chips P;

c) forming a redistribution layer 4 comprising metal tracks 40 that are electrically connected to the through-vias 100, the metal tracks 40 having lateral ends 400 extending into each spacing region ZE;

d) forming metal pillars PM on the lateral ends 400 of the metal tracks 40;

e) moulding a material 5 on the redistribution layer 4, the material 5 comprising:

first segments 50, facing the first layers 1 of the electronic chips P,
second segments 51, which are separate from the first segments 50, and which extend in the spacing regions ZE around the metal pillars PM; the first and second segments 50, 51 of the material 5 being coplanar; the material 5 possessing a formation temperature;

f) applying a heat treatment at the formation temperature of the material 5, the first and second segments 50, 51 of the material 5 being mechanically attached to the first layers 1 and to the carrier substrate SS, respectively, the formed material 5 possessing a second thickness, and a second coefficient of thermal expansion strictly higher than the first coefficient of thermal expansion; the ratio between the first and second coefficients of thermal expansion, the ratio between the first and second thicknesses and the formation temperature being adapted so that, at the end of step f), the stack of each electronic chip P is curved with a preset convex shape, which is oriented toward the matrix-array of pixels 2, at a given corresponding operating temperature of the electronic chip P; the second segments 51 of the material 5 formed around the metal pillars PM remaining coplanar at the end of step f).

Figure 3A:
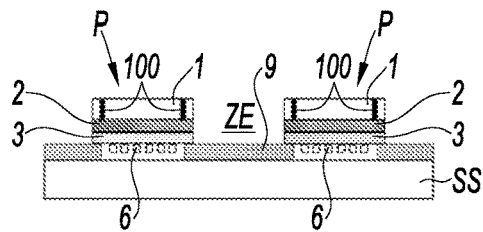
FIGS. 3a to 3j are schematic cross-sectional views illustrating a mode of implementation of a process according to the invention for an FSI image sensor.
Figure 3B:
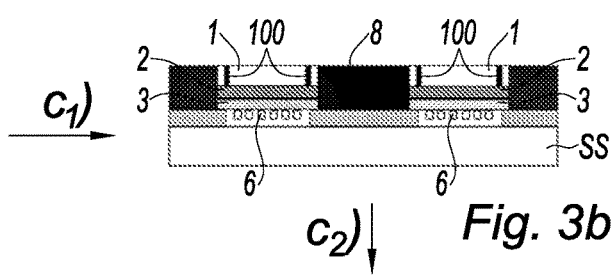
Figure 3C:
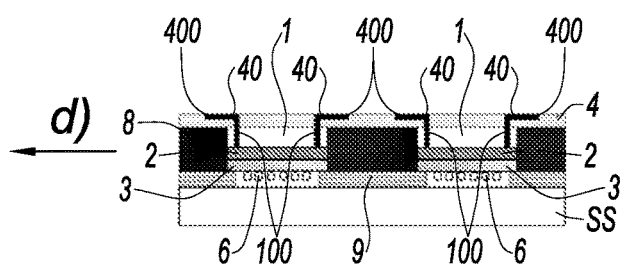
Figure 3D:
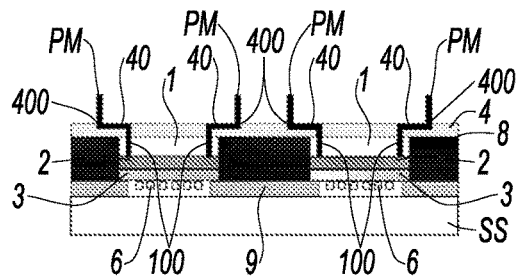
Figure 3E:
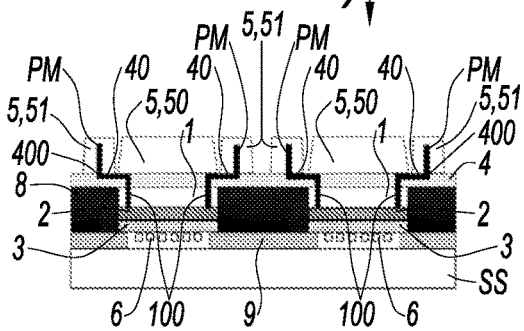
Figure 3F:
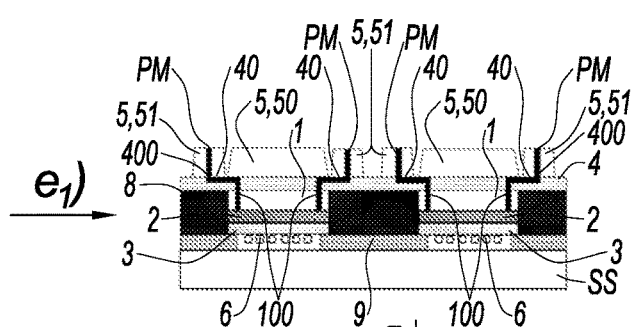
Figure 3G:
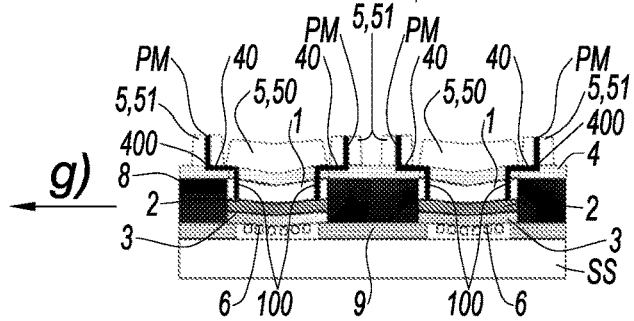
Figure 4A:
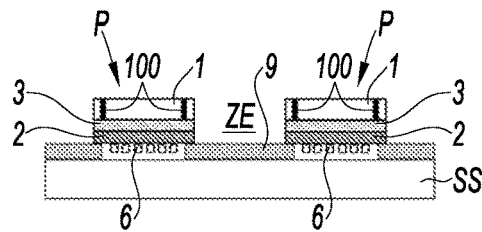
FIGS. 4a to 4j are schematic cross-sectional views illustrating a mode of implementation of a process according to the invention for a BSI image sensor.

Step b) is illustrated in FIGS. 3a and 4a. Step c) is illustrated in FIGS. 3b-3c and 4b-4c. Step d) is illustrated in FIGS. 3d and 4d. Step e) is illustrated in FIGS. 3e and 4e. Step f) is illustrated in FIGS. 3g and 4g.

First Layer

The first layer 1 comprises opposite first and second surfaces 10, 11. The first layer 1 is advantageously obtained from a first substrate 1' that is thinned to promote the curvature of the electronic chips P. The first layer 1 advantageously has a thickness smaller than 500 µm, preferably smaller than 100 µm, and more preferably smaller than 50 µm. Such a thickness range allows the curvature at the end of step f) to be promoted. The first layer 1 is advantageously made of a semiconductor material, preferably silicon. In the case where the first layer 1 is made of silicon, the through-vias 100 are through-silicon vias (TSV).

FSI Image Sensor

Step a) may be executed so that:

the matrix-array of pixels 2 is formed on the first layer 1,
the interconnect layer 3 is formed on the matrix-array of pixels 2,
the stack comprises a matrix-array of focusing lenses 6, formed on the interconnect layer 3.

More precisely, the matrix-array of pixels 2 is formed on the first surface 10 of the first layer 1. By "formed on the surface", what is meant is formed on or through the surface.

Thus, when the electronic chips P are front-side-illuminated (FSI) image sensors, the incident light penetrates via the interconnect layer 3, and the matrix-array of pixels 2 is located downstream of the interconnect layer 3.

It will be noted that the matrix-array of focusing lenses 6 may be optional in certain types of sensors, and notably in cooled infrared sensors.

BSI Image Sensor

Step a) may be executed so that:
the interconnect layer 3 is formed on the first layer 1,
the matrix-array of pixels 2 is formed on the interconnect layer 3,
the stack comprises a matrix-array of focusing lenses 6, formed on the matrix-array of pixels 2.

More precisely, the interconnect layer 3 is formed on the first surface 10 of the first layer 1. By "formed on the surface", what is meant is formed on or through the surface. Thus, when the electronic chips P are back-side-illuminated (BSI) image sensors, the incident light penetrates into the matrix-array of pixels 2, which is located upstream of the interconnect layer 3, this preventing energy loss, and thereby increasing the sensitivity of the image sensor.

It will be noted that the matrix-array of focusing lenses 6 may be optional in certain types of sensors, and notably in cooled infrared sensors.

Preparation of the Electronic Chips

As illustrated in FIGS. 1a to 1d and 2a to 2d, step a) advantageously comprises the steps:

$a_1$) providing a first substrate 1', on which is formed the set of electronic chips P;

$a_2$) joining a temporary substrate 7 to the set of electronic chips P;

$a_3$) thinning the first substrate 1' until the first layer 1 is obtained;

$a_4$) forming through-vias 100 in the first layer 1;

$a_5$) dicing the electronic chips P individually.

In the case of an FSI image sensor illustrated in FIGS. 1a to 1d, step $a_2$) is executed so that the temporary substrate 7 is joined to the interconnect layer 3. By way of nonlimiting example, the temporary substrate 7 joined in step $a_2$) may be an adhesive film, arranged on the side of the interconnect layer 3, suction being applied to this film via a vacuum chuck. The use of a temporary substrate 7 permits the first substrate 1' to be thinned to ensure the stack has the required mechanical strength.

Step $a_3$) is preferably executed by chemical-mechanical polishing, preceded by grinding.

Figure 1D:
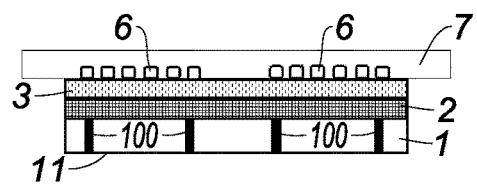

As illustrated in FIG. 1d, step $a_4$) consists in forming through-vias 100 through the first layer 1, said vias being electrically connected to the interconnect layer 3.

By way of nonlimiting example, step $a_5$) may be executed using a precision circular saw, with a resin- or metal-bonded diamond blade.

In the case of a BSI image sensor illustrated in FIGS. 2a to 2d, step $a_2$) is executed so that the temporary substrate 7 is joined to the matrix-array of pixels 2. By way of nonlimiting example, the temporary substrate 7 joined in step $a_2$) may be an adhesive film, arranged on the side of the matrix-array of pixels 2, suction being applied to this film via a vacuum chuck. The use of a temporary substrate 7 permits the first substrate 1' to be thinned to ensure the stack has the required mechanical strength.

Figure 6:
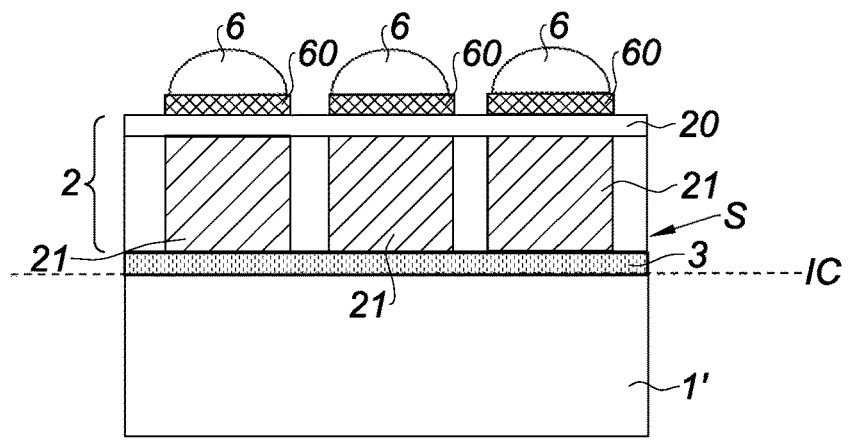
FIG. 6 is a partial schematic cross-sectional view of a BSI image sensor provided in step a) of a process according to the invention. The dashed line represents the bonding interface.
Figure 7:
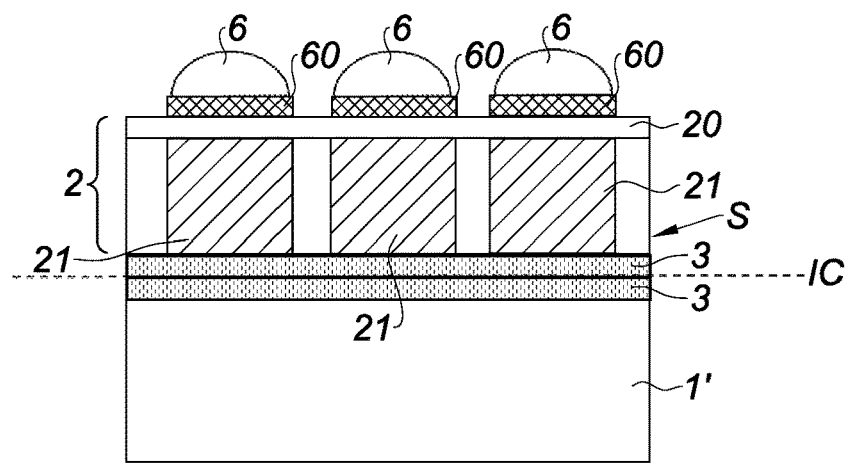
FIG. 7 is a partial schematic cross-sectional view of a 3D stacked BSI image sensor provided in step a) of a process according to the invention. The dashed line represents the bonding interface.

As illustrated in FIGS. 6 and 7, the set of electronic chips P may be formed before step $a_1$) within a substrate S that is then bonded to the first substrate 1'. The dashed line shows the bonding interface IC. As illustrated in FIG. 7, the first substrate 1' may be equipped with a read circuit capable of simultaneously reading each pixel of a matrix-array formed in the substrate S.

Step $a_3$) is preferably executed by chemical-mechanical polishing, preceded by grinding.

Figure 2A:
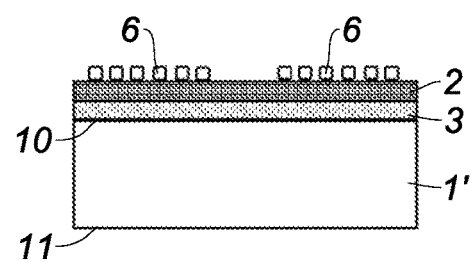
FIGS. 2a to 2d are schematic cross-sectional views illustrating the preparation of BSI image sensors in step a) of a process according to the invention.
Figure 2B:
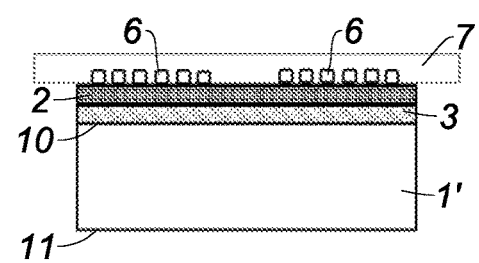
Figure 2C:
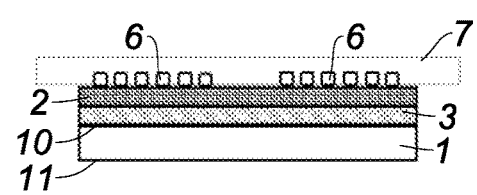
Figure 2D:
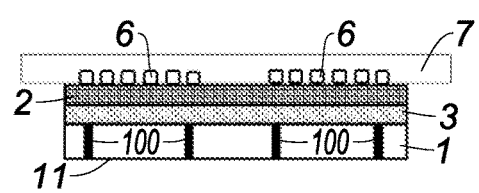

As illustrated in FIG. 2d, step $a_4$) consists in forming through-vias 100 through the first layer 1, said vias being electrically connected to the interconnect layer 3.

By way of nonlimiting example, step $a_5$) may be executed using a precision circular saw, with a resin- or metal-bonded diamond blade.

Interconnect Layer

The interconnect layer 3 is a stack of interconnect levels comprising metal tracks embedded in a dielectric material. By way of nonlimiting example, the metal tracks may be made of copper, tungsten, titanium or of aluminium, and the dielectric material may be organic (a polymer such as a polyimide, or ALX (sold by ASAHI GLASS)) or inorganic ($SiO_2$, SiN, etc.).

Matrix-Array of Pixels

The pixels 2 may be photosensitive cells (also called photosites) in the case of an electronic chip P of an image sensor. The pixels 2 may be the light-emitting (or emissive) cells in the case of an electronic chip P of a display.

Figure 5:
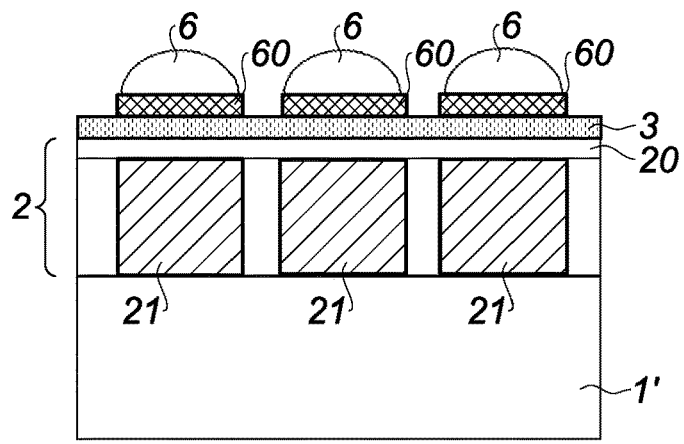
FIG. 5 is a partial schematic cross-sectional view of an FSI image sensor provided in step a) of a process according to the invention.

As illustrated in FIGS. 5 to 7, when the electronic chip P is an image sensor, the matrix-array of pixels 2 is advantageously equipped with photodiodes 21 that are linked to the surface 20 that receives the incident light. The matrix-array of pixels 2 is advantageously equipped with a complementary metal-oxide-semiconductor (CMOS) circuit configured to process the electrical signal generated by the photodiodes 21 (amplification of the signal, pixel selection, etc.).

When the electronic chip P is a display, the matrix-array of pixels 2 is advantageously equipped with light-emitting diodes (not illustrated). The light-emitting diodes may be organic or inorganic. The matrix-array of pixels 2 is advantageously equipped with a CMOS circuit configured to control the light-emitting diodes.

As illustrated in FIGS. 5 to 7, the matrix-array of pixels 2 is advantageously equipped with colour filters 60. When the electronic chip P is an image sensor, the colour filters 60 are advantageously arranged in a Bayer pattern. The colour filters 60 are interposed between the surface 20 that receives the incident light and the matrix-array of focusing lenses 6.

Matrix-Array of Focusinq Lenses

In the case of an electronic chip P of an image sensor comprising a matrix-array of focusing lenses 6, the focusing lenses 6 are convergent so as to concentrate the incident light toward the matrix-array of pixels 2. Each focusing lens 6 is associated with one pixel. The focusing lenses 6 are preferably micro-lenses.

Carrier Substrate

Step b) is advantageously executed so that the carrier substrate SS is transparent in the spectral domain of operation of the electronic chips P. By way of nonlimiting example, the carrier substrate SS may be made of glass.

The electronic chips P, which are diced beforehand, are advantageously transferred to the carrier substrate SS in step b) using a pick-and-place machine.

Step b) is advantageously executed so that the carrier substrate SS comprises spacers 9 to which the diced electronic chips P are joined. The electronic chips P are preferably bonded to the spacers 9 using a thixotropic adhesive.

Redistribution Layer

Step c) advantageously comprises the steps:

$c_1$) forming a dielectric layer 8 that fills the spacing regions ZE so as to lie flush with the first layers 1 of the electronic chips P, the dielectric layer 8 being mechanically attached to the carrier substrate SS;

$c_2$) forming the redistribution layer 4, the latter extending over the first layers 1 of the electronic chips P and over the dielectric layer 8, the redistribution layer 4 being mechanically attached to the first layers 1 and to the dielectric layer 8.

Figure 4B:
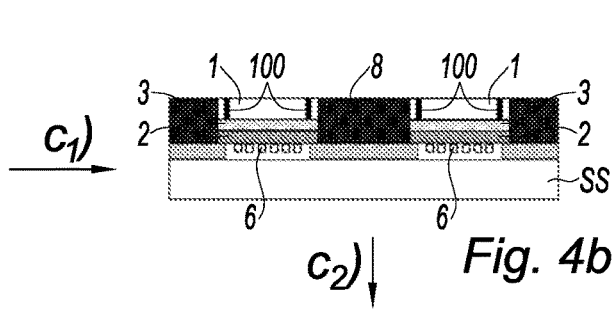
Figure 4C:
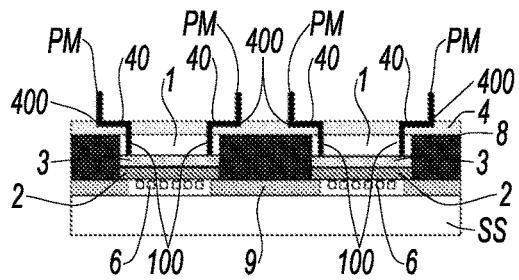
Figure 4D:
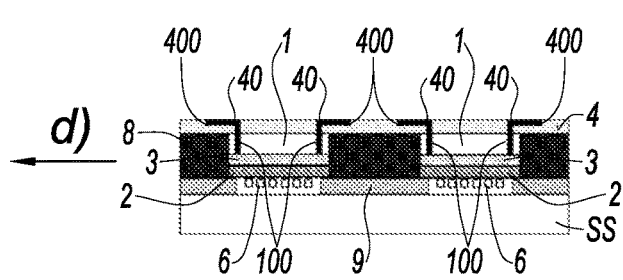
Figure 4E:
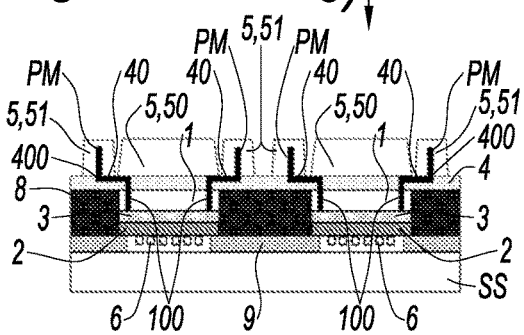

Step $c_1$) is illustrated in FIGS. 3b and 4b. Step $c_2$) is illustrated in FIGS. 3c and 4c.

The dielectric layer 8 formed in step $c_1$) may be a resist, for example a SINR™ resist as sold by Shin-Etsu MicroSi, or a polyimide. Step $c_1$) is executed so that the dielectric layer 8 is formed on the spacers 9.

More precisely, step $c_2$) is executed so that the redistribution layer 4 extends over the second surface 11 of the first layers 1 of the electronic chips P and over the dielectric layer 8.

The redistribution layer 4 comprises metal tracks 40 embedded in a dielectric material. By way of non-limiting example, the metal tracks 40 may be made of Cu, Al, W, Ti. The dielectric material may be a resist, for example a SINR™ resist, or a polyimide.

Metal Pillars

The metal pillars PM are preferably made of aluminium or of copper.

For example, a metal seed layer may be deposited on the redistribution layer 4.

The seed layer allows the wafer-level electrical contact required for the future electrodeposition of the metal pillars PM to be obtained. The seed layer may comprise a plurality of sublayers, including a sublayer suitable for achieving mechanical coupling. The seed layer may have a thickness of the order of 300 nm. By way of nonlimiting example, the seed layer may comprise a first sublayer made of Ti of 100 nm thickness and a second sublayer made of Cu of 200 nm thickness. Next, a photoresist may be deposited on the seed layer, then exposed to ultraviolet radiation through a mask so as to form patterns delineating the future metal pillars PM. The thickness of the photoresist is chosen so as to be equal to the height of the future metal pillars PM. The seed layer is then biased in a dedicated bath allowing the metal pillars PM to be electrodeposited. Lastly, the photoresist is removed, and the portion of the seed layer lying under the photoresist during the electrodeposition is etched.

Figure 4F:
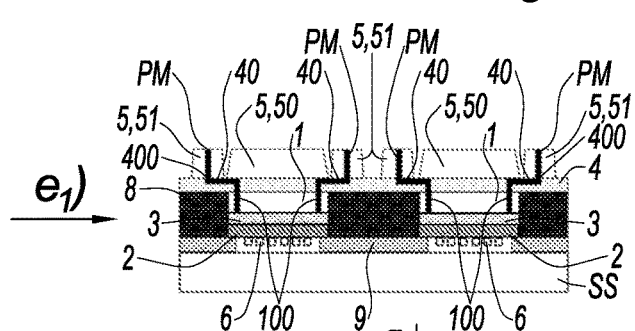
Figure 4G:
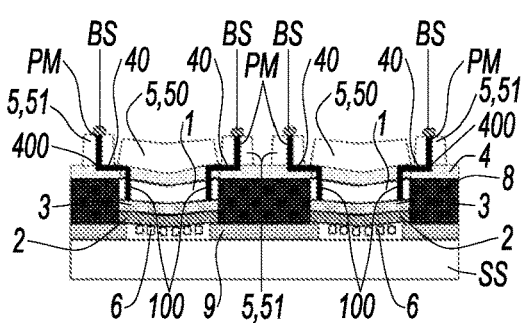

Step f) is advantageously preceded by a step $e_1$) consisting in planarizing the material 5 so as to free the metal pillars PM. Step $e_1$) is illustrated in FIGS. 3f and 4f. By way of nonlimiting example, step $e_1$) may be executed by chemical-mechanical polishing or by plasma etching.

Material

The material 5 formed in step f) is mechanically attached to the redistribution layer 4. Since the redistribution layer 4 is mechanically attached to the first layers 1 of the electronic chips P, the first segments 50 of the material 5 formed in step f) are mechanically attached (indirectly) to the first layers 1 of the electronic chips P. Furthermore, the second segments 51 of the material 5 that are formed in step f) are mechanically attached (indirectly) to the carrier substrate SS. Specifically, the spacers 9 are mechanically attached to the carrier substrate SS, the dielectric layer 8 is mechanically attached to the spacers 9, and the redistribution layer 4 is mechanically attached to the dielectric layer 8.

Step f) is advantageously executed so that the first and second coefficients of thermal expansion respect:

$$\frac{\alpha_2}{\alpha_1} \geq 4,$$

and preferably $$\frac{\alpha_2}{\alpha_1} \geq 6,$$

where:
- $\alpha_1$ is the coefficient of thermal expansion of the stack,
- $\alpha_2$ is the coefficient of thermal expansion of the formed material 5.

It is possible to measure the coefficient of thermal expansion of the stack using a technique known to those skilled in the art, as described in chapter 2 of the document "ASM Ready Reference: Thermal Properties of Metals», ASM International, 2002, or even in the document B. Cassel et al., «Coefficient of Thermal Expansion Measurement using the TMA 4000», PerkinElmer, Inc., 2013.

To a first approximation, the coefficient of thermal expansion of the stack is substantially equal to the coefficient of thermal expansion of the first layer 1 in so far as the thickness of the first layer 1 is predominant in the stack. When the first layer 1 is made of silicon, $\alpha_1$ is about $2.5 \times 10^{-6}$ K$^{-1}$. The material 5 will therefore be chosen to have an $\alpha_2$ such that $\alpha_2 \geq 10^{-5}$ K$^{-1}$, and preferably such that $\alpha_2 \geq 1.5 \times 10^{-5}$ K$^{-1}$. The radius of curvature obtained at the end of step f) may be computed depending on $\alpha_1$ and $\alpha_2$ by virtue of Stoney's formula, which is known to those skilled in the art.

Step f) is advantageously executed so that the formed material 5 possesses a Young's modulus higher than 100 MPa, preferably higher than 1 GPa, and more preferably higher than 3 GPa.

The formed material 5 advantageously has a second thickness comprised between 120 μm and 600 μm. The material 5 may be monolayer or multilayer. To a first approximation, the ratio between the first thickness (of the stack) and the second thickness (of the formed material 5), which has an influence on the curvature of the convex shape, may be considered to be governed by the ratio between the thickness of the first layer 1 and the second thickness in so far as the thickness of the first layer 1 is predominant in the stack. The formed material 5 will preferably be chosen to have a second thickness about 2.5 times larger than the thickness of the first layer 1 when the first layer 1 is made of silicon in order to optimize the curvature of the convex shape, depending on the envisaged application. When the material 5 is polished in step $e_1$), the second thickness of the polished material 5 is advantageously at least 2 times larger than the thickness of the first layer 1 when the first layer 1 is made of silicon. Thus, the curvature of the convex shape is little affected at the end of step f).

Step e) is advantageously executed so that the material 5 is a thermosetting polymer, preferably chosen from an epoxy resin and a polysiloxane resin. Where appropriate, the second coefficient of thermal expansion is the coefficient of thermal expansion of the set polymer. By way of non-limiting example, the thermosetting polymer may be:
- an epoxy resin, with a Young's modulus of about 9 GPa, $\alpha_2$ comprised between $3.1 \times 10^{-5}$ K$^{-1}$ and $1.14 \times 10^{-4}$ K$^{-1}$, and a cross-linking temperature of about 71° C.;

a polysiloxane resin, with a Young's modulus of about 3.3 GPa, $\alpha_2$ comprised between $2\times10^{-5}$ $K^{-1}$ and $9.1\times10^{-5}$ $K^{-1}$, and a cross-linking temperature of about 180° C.

The material 5 possesses a formation temperature (e.g. cross-linking temperature) strictly above the given operating temperature of the electronic chips P. Step e) is preferably executed using an injection mould. The injection mould is made of a material that is refractory at the formation temperature of the material 5, the cross-linking temperature of the thermosetting polymer for example. The injection mould is preferably made of silicone.

Preset Convex Shape

The preset convex shape may have a constant or variable radius of curvature (of given sign). The preset convex shape may be aspherical. The (constant or variable) radius of curvature is preset depending on the envisaged application.

Finalization

Figure 3H:
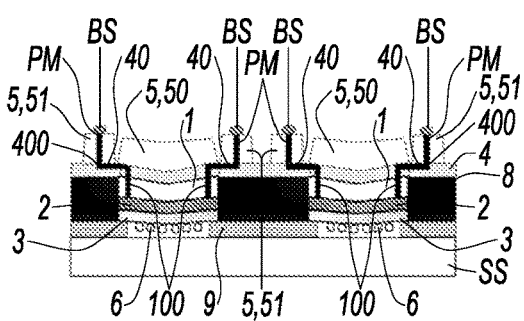
Figure 4H:
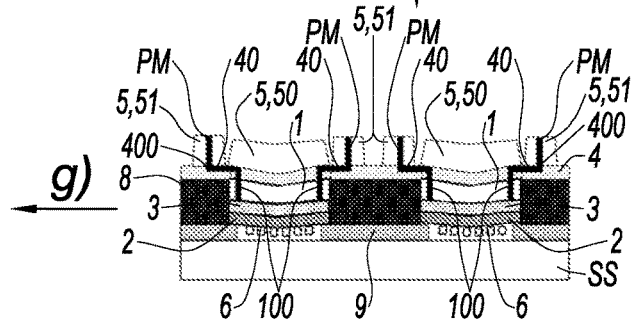

The process advantageously comprises a step g) consisting in forming solder bumps BS on the second segments 51 of the material 5 at the end of step f), the solder bumps BS making contact with the metal pillars PM. Step g) is illustrated in FIGS. 3h and 4h.

Figure 3I:
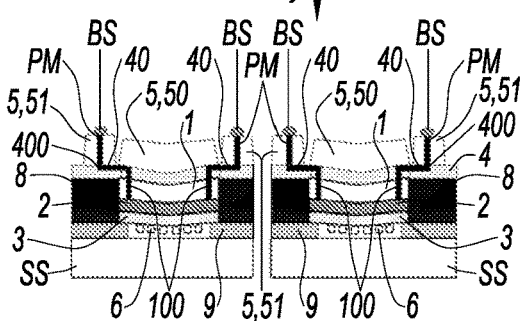
Figure 3J:
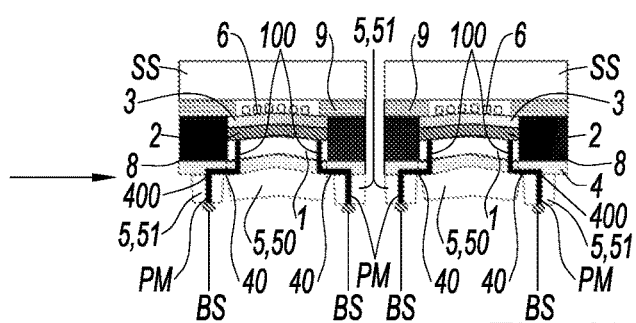
Figure 4I:
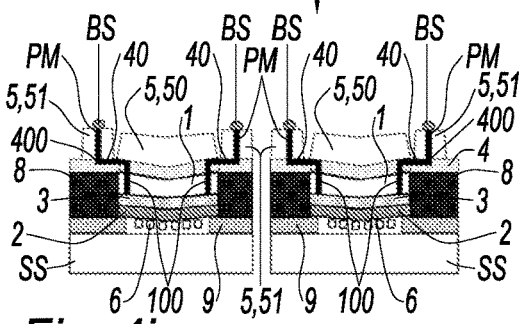
Figure 4J:
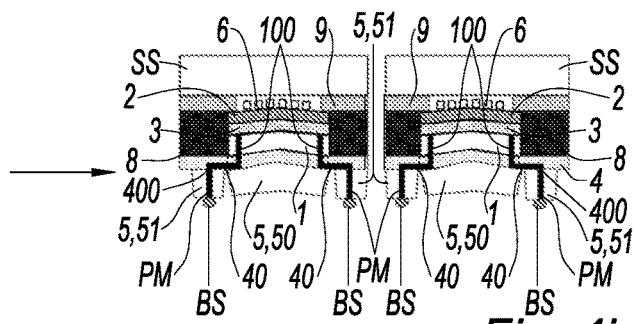

Step g) is advantageously followed by a step h) consisting in dicing the electronic chips P. Step h) is illustrated in FIGS. 3i and 4i. By way of nonlimiting example, step h) may be executed using a precision circular saw, with a resin- or metal-bonded diamond blade.

The invention is not limited to the described embodiments. Those skilled in the art will be able to envisage technically workable combinations thereof and to substitute equivalents therefor.

The invention claimed is:

1. A process for collectively curving a set of electronic chips, comprising the steps:
   a) providing the set of electronic chips, the chips having been diced beforehand and each comprising a stack comprising:
   a matrix-array of pixels,
   an interconnect layer, electrically connected to the matrix-array of pixels, and
   a first layer, comprising through-vias that are electrically connected to the interconnect layer; the stack possessing a first thickness and a first coefficient of thermal expansion;
   b) joining the set of diced electronic chips to a carrier substrate, via a side opposite the first layers, so as to leave a spacing region between adjacent electronic chips;
   c) forming a redistribution layer comprising metal tracks that are electrically connected to the through-vias, the metal tracks having lateral ends extending into each spacing region;
   d) forming metal pillars on the lateral ends of the metal tracks;
   e) moulding a material on the redistribution layer, the material comprising:
   first segments, facing the first layers of the electronic chips, and
   second segments, which are separate from the first segments, and which extend in the spacing regions around the metal pillars; the first and second segments of the material being coplanar; the material possessing a formation temperature; and
   f) applying a heat treatment at the formation temperature of the material, the first and second segments of the material being mechanically attached to the first layers and to the carrier substrate, respectively, the material possessing a second thickness, and a second coefficient of thermal expansion strictly higher than the first coefficient of thermal expansion; a ratio between the first and second coefficients of thermal expansion, a ratio between the first and second thicknesses, and the formation temperature being adapted so that, at the end of step f), the stack of each electronic chip is curved with a preset convex shape, when viewed from the matrix-array of pixels, at a given corresponding operating temperature of the electronic chip; the second segments of the material formed around the metal pillars remaining coplanar at the end of step f).

2. The process according to claim 1, wherein step f) is preceded by a step $e_1$) of planarizing the material so as to free the metal pillars.

3. The process according to claim 1, comprising a step g) of forming solder bumps on the second segments of the material at the end of step f), the solder bumps making contact with the metal pillars.

4. The process according to claim 3, wherein said step g) is followed by a step h) of dicing the carrier substrate to separate the electronic chips.

5. The process according to claim 1, wherein step b) is executed so that the carrier substrate is transparent in the spectral domain of operation of the electronic chips.

6. The process according to claim 1, wherein step b) is executed so that the carrier substrate comprises spacers to which the diced electronic chips are joined.

7. The process according to claim 1, wherein step c) comprises the steps:
   $c_1$) forming a dielectric layer that fills the spacing regions so as to lie flush with the first layers of the electronic chips, the dielectric layer being mechanically attached to the carrier substrate; and
   $c_2$) forming the redistribution layer, the latter extending over the first layers of the electronic chips and over the dielectric layer, the redistribution layer being mechanically attached to the first layers and to the dielectric layer.

8. The process according to claim 1, wherein step a) comprises the steps:
   $a_1$) providing a first substrate, on which is formed the set of electronic chips;
   $a_2$) joining a temporary substrate to the set of electronic chips;
   $a_3$) thinning the first substrate until the first layer is obtained;
   $a_4$) forming through-vias in the first layer; and
   $a_5$) dicing the electronic chips individually.

9. The process according to claim 1, wherein step a) is executed so that:
   the interconnect layer is formed on the first layer,
   the matrix-array of pixels is formed on the interconnect layer, and
   the stack comprises a matrix-array of focusing lenses, formed on the matrix-array of pixels.

10. The process according to claim 1, wherein step a) is executed so that:
    the matrix-array of pixels is formed on the first layer,
    the interconnect layer is formed on the matrix-array of pixels, and
    the stack comprises a matrix-array of focusing lenses, formed on the interconnect layer.

11. The process according to claim 1, wherein step e) is executed so that the material is a thermosetting polymer, chosen from an epoxy resin and a polysiloxane resin.

12. The process according to claim 1, wherein step f) is executed so that the first and second coefficients of thermal expansion respect:

$$\frac{\alpha_2}{\alpha_1} \geq 4,$$

where:
- $\alpha_1$ is the first coefficient of thermal expansion of the stack, and
- $\alpha_2$ is the second coefficient of thermal expansion of the material.

13. The process according to claim 1, wherein step f) is executed so that the material possesses a Young's modulus higher than 100 MPa.

14. The process according to claim 1, wherein step f) is executed so that the first and second coefficients of thermal expansion respect:

$$\frac{\alpha_2}{\alpha_1} \geq \frac{\alpha_2}{\alpha_1} \geq 6,$$

where:
- $\alpha_1$ is the first coefficient of thermal expansion of the stack,
- $\alpha_2$ is the second coefficient of thermal expansion of the material.

15. The process according to claim 1, wherein step f) is executed so that the material possesses a Young's modulus higher than 1 GPa.

16. The process according to claim 1, wherein step f) is executed so that the material possesses a Young's modulus higher than 3 GPa.

* * * * *